United States Patent [19]

Hopkins et al.

[11] 4,050,764
[45] Sept. 27, 1977

[54] INTRINSIC CERTIFICATION ASSEMBLY TECHNIQUE FOR WIRING COMPONENTS INTO AN ELECTRICAL APPARATUS

[75] Inventors: John Root Hopkins, Belleair, Fla.; Robert Maurice Renn; Robert Keith Southard, both of Harrisburg, Pa.

[73] Assignee: AMP Incorporated, Harrisburg, Pa.

[21] Appl. No.: 715,095

[22] Filed: Aug. 17, 1976

Related U.S. Application Data

[62] Division of Ser. No. 649,009, Jan. 14, 1976, Pat. No. 4,006,959, which is a division of Ser. No. 520,399, Nov. 4, 1974, Pat. No. 3,970,354.

[51] Int. Cl.² ............................................. H01R 3/00
[52] U.S. Cl. ............................ 339/103 M; 339/113 L
[58] Field of Search .......... 339/103 M, 103 R, 103 C, 339/113 L, 113 R, 125 R, 38

[56] References Cited

FOREIGN PATENT DOCUMENTS 935,829  9/1963  United Kingdom .................. 339/38

*Primary Examiner*—Roy Lake
*Assistant Examiner*—DeWalden W. Jones
*Attorney, Agent, or Firm*—Russell J. Egan

[57] ABSTRACT

A technique is described for completely and positively wiring components into mass produced machines, such as washing machines, dryers and the like. The subject technique encompasses improved contacts, connectors and a wiring harness all of which are individually and collectively adopted to provide a readily ascertainable positive visual indication of a full mating condition and which will prevent further assembly of components if not initially fully assembled in the proper relationship. Each subassembly of a connector and related component includes keying means allowing only correct assembly and mounting in the machine plus visual indicators which verify correct assembly at each step. The connectors preferably have housings which can be produced in great lengths and cut to the desired shorter lengths. These housings also include strain relief means for the associated conductors and may be hermaphroditic. Each contact terminal includes an insulation displacing conductor engaging portion, enabling rapid connection with associated conductors, and a matable portion adopted to readily engage several different size mating contacts. In the preferred embodiment, the contact terminal is also completely hermaphroditic both in the manner it mates with other contacts and with regard to which end makes an insulation displacing engagement with an associated conductor.

1 Claim, 34 Drawing Figures

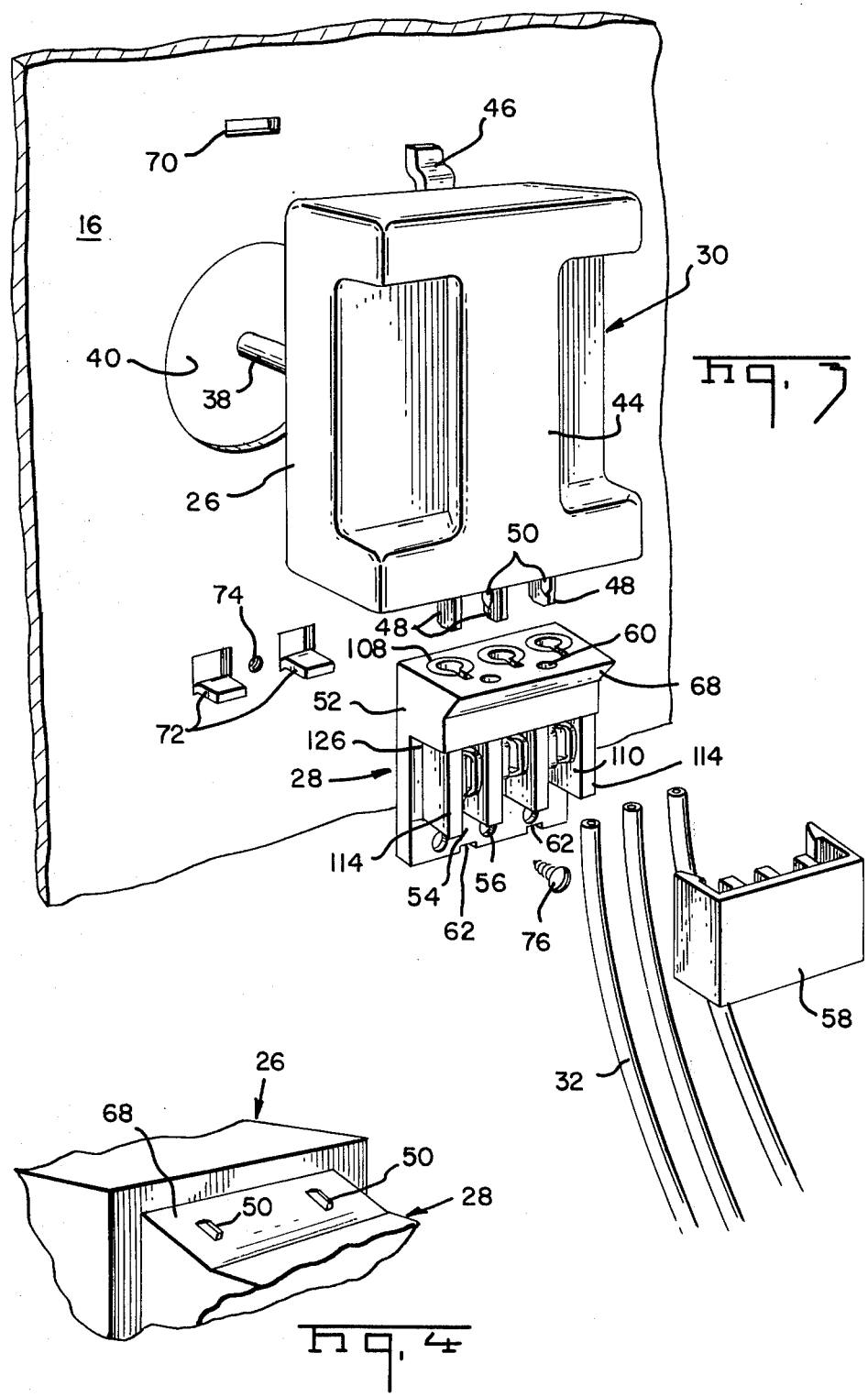

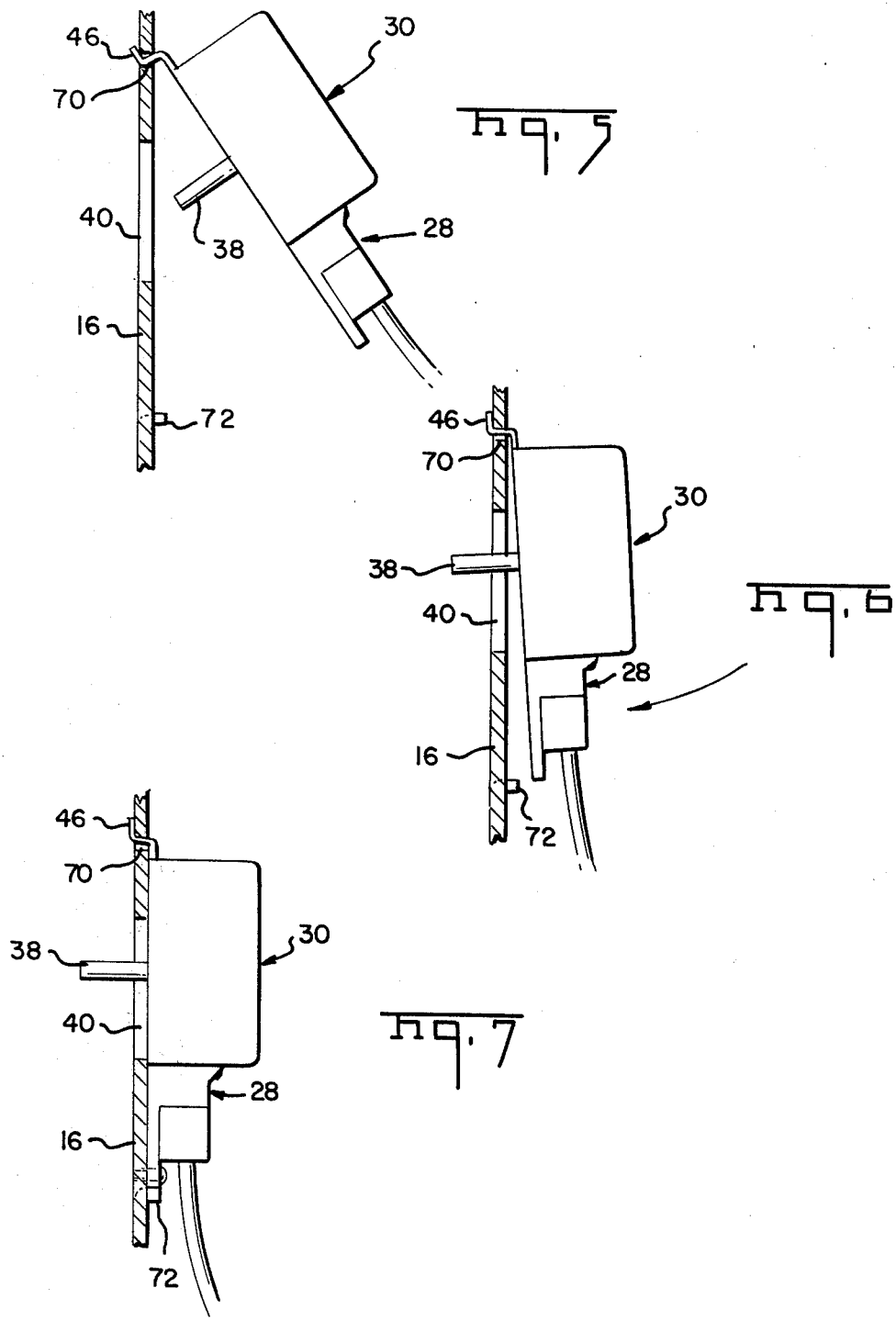

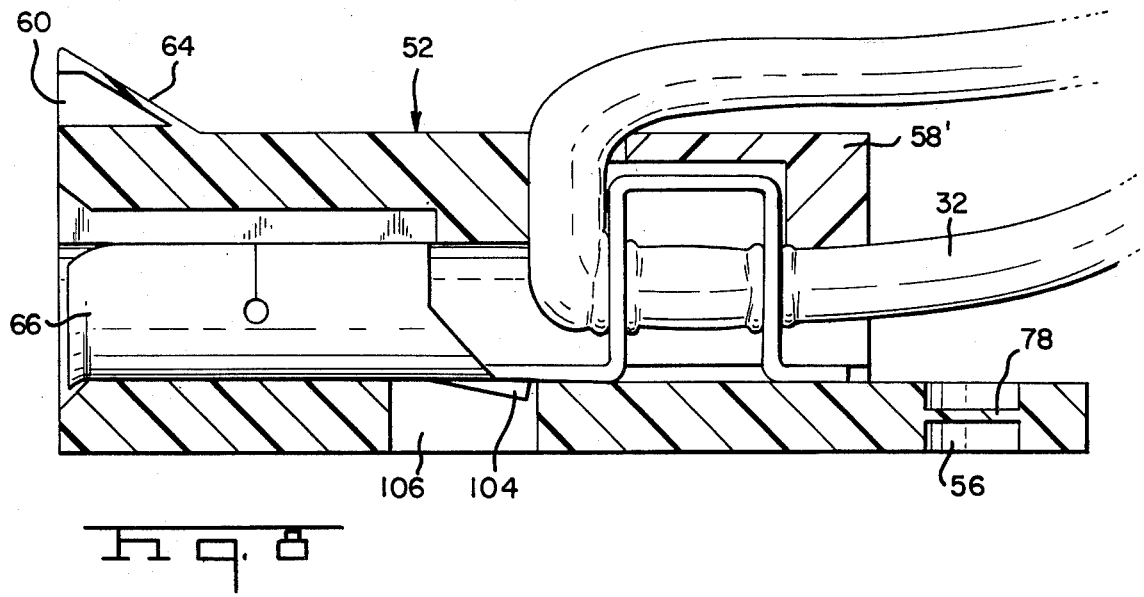
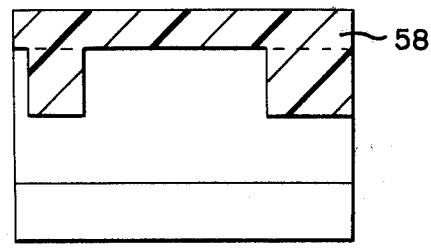
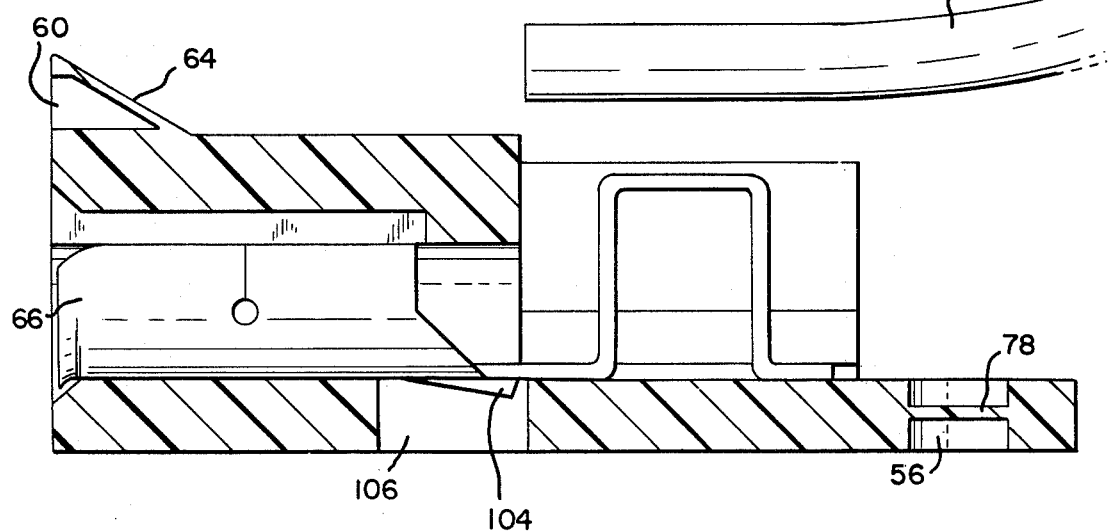

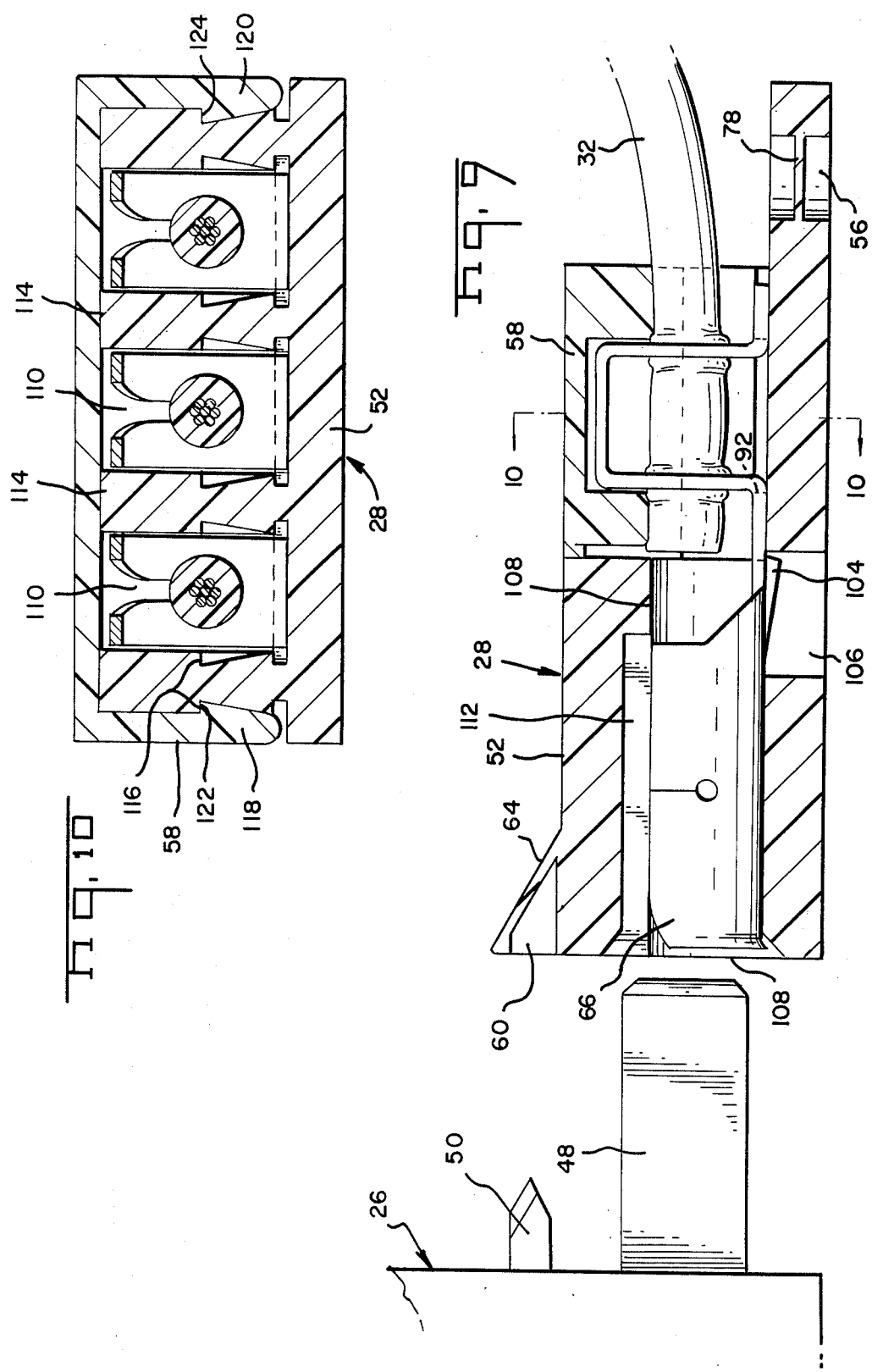

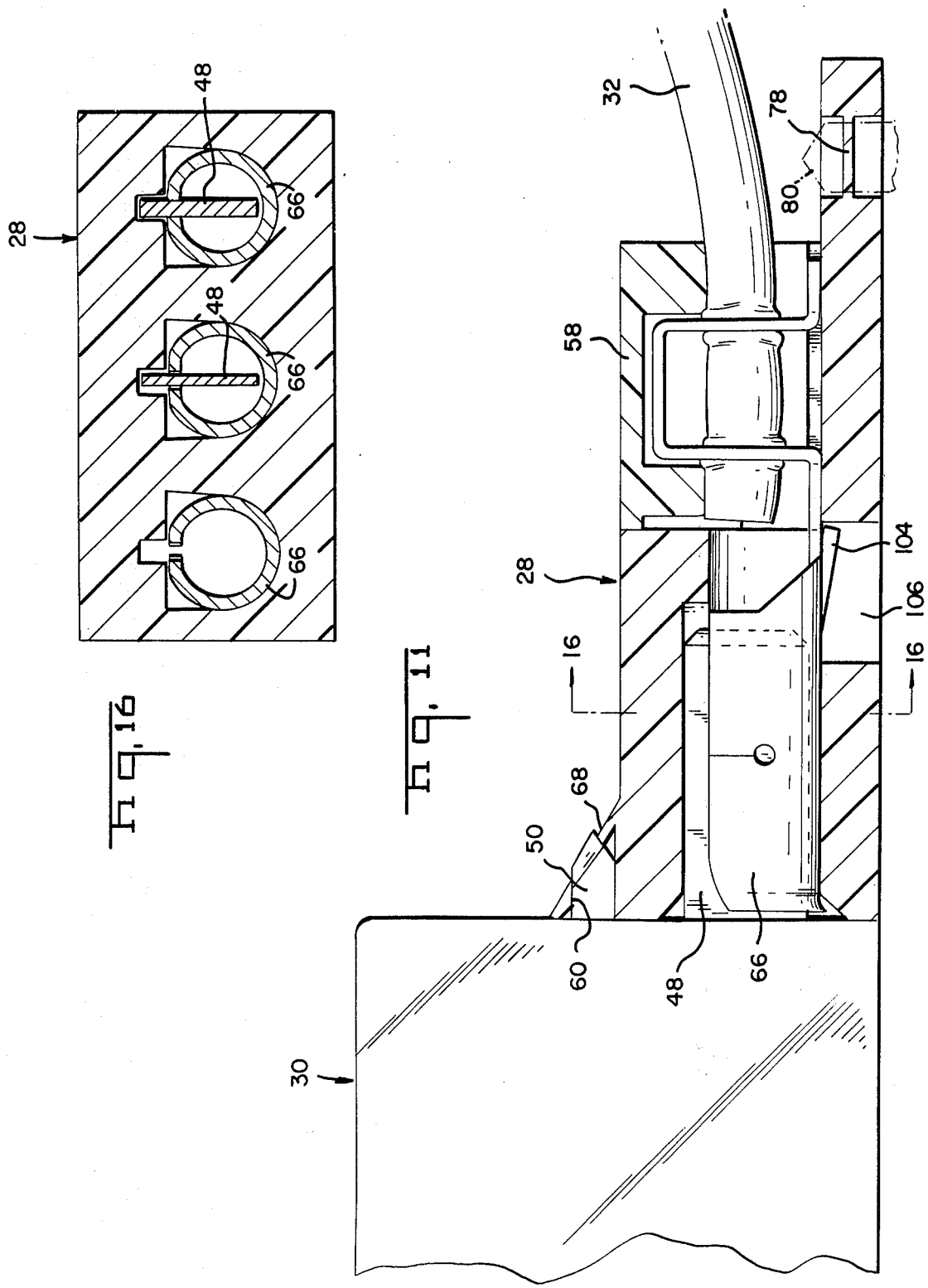

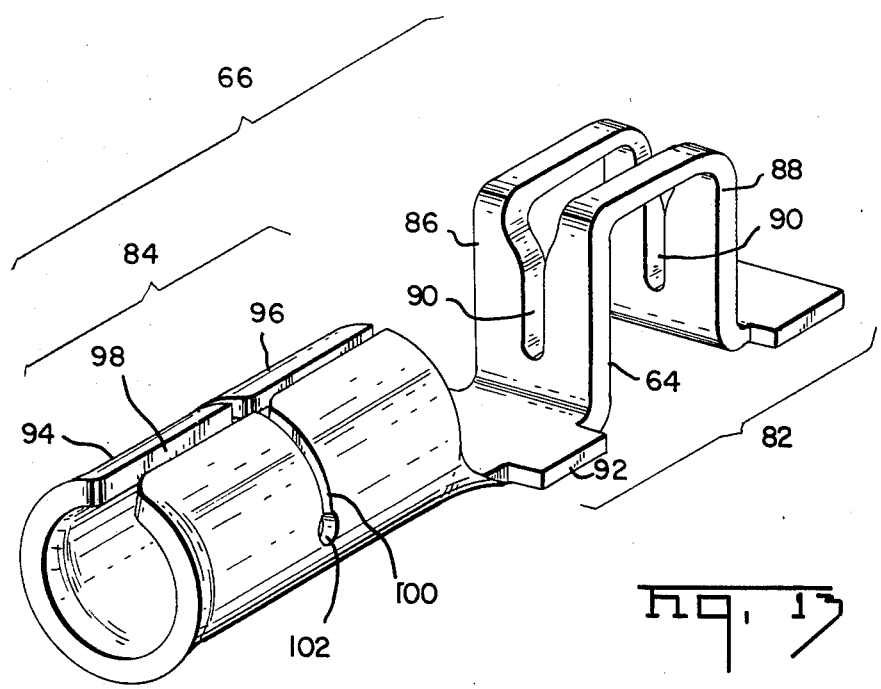
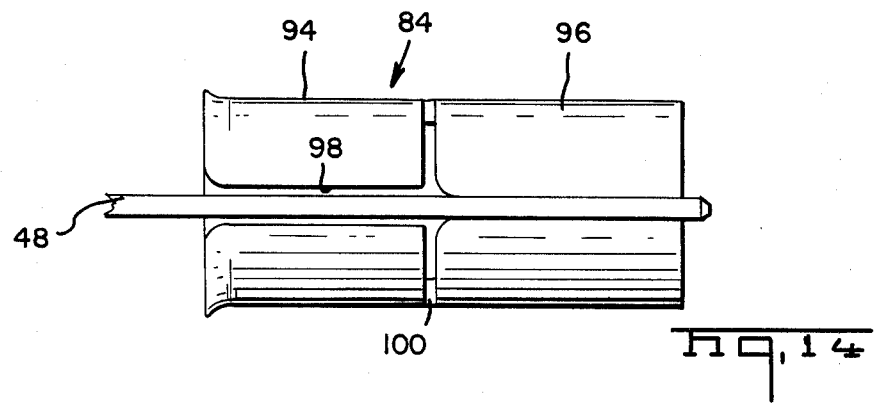
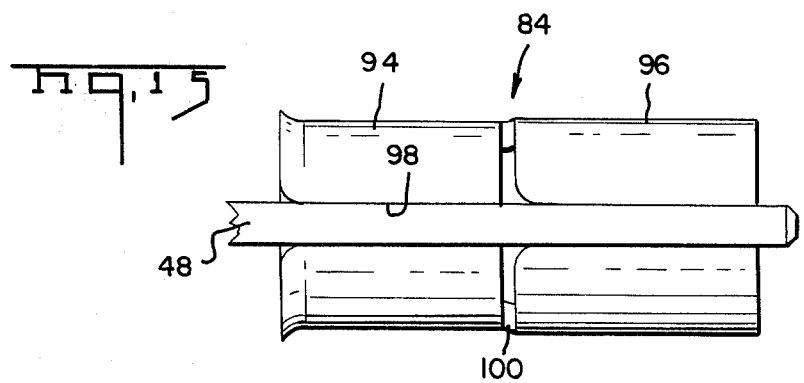

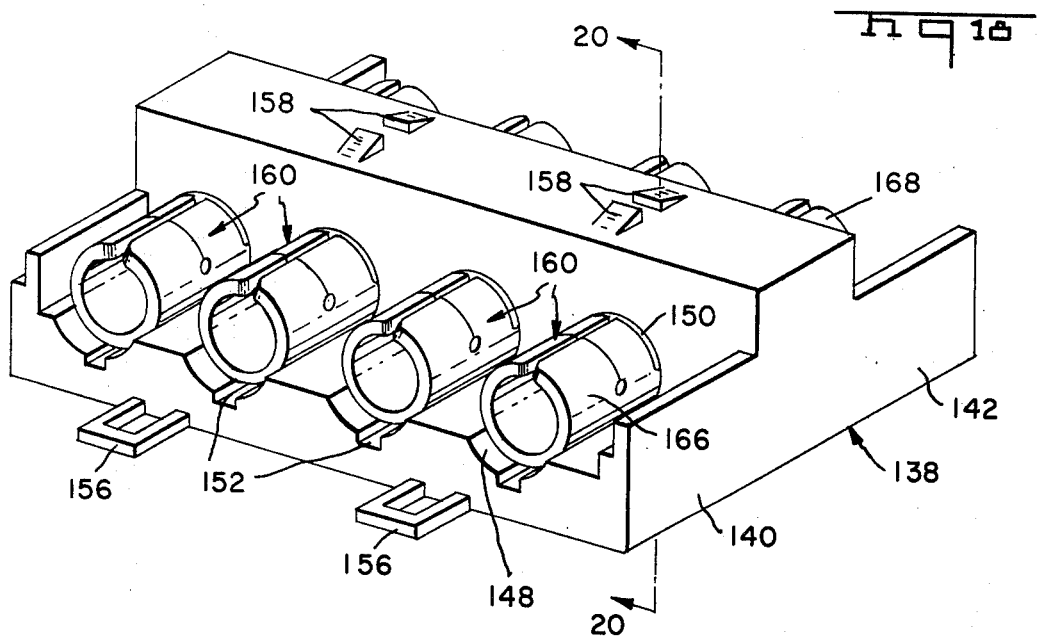
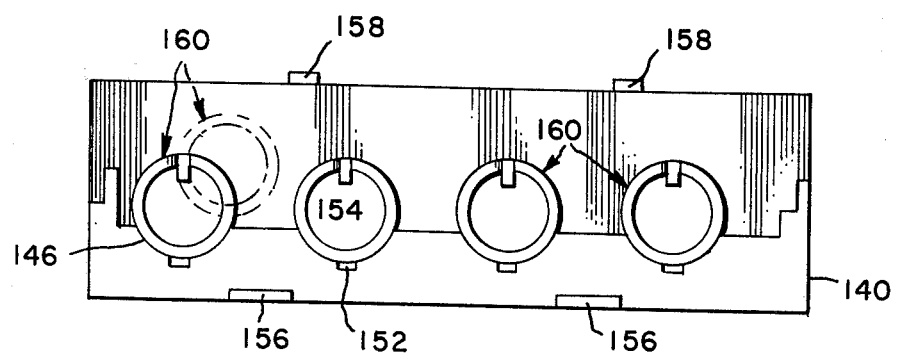

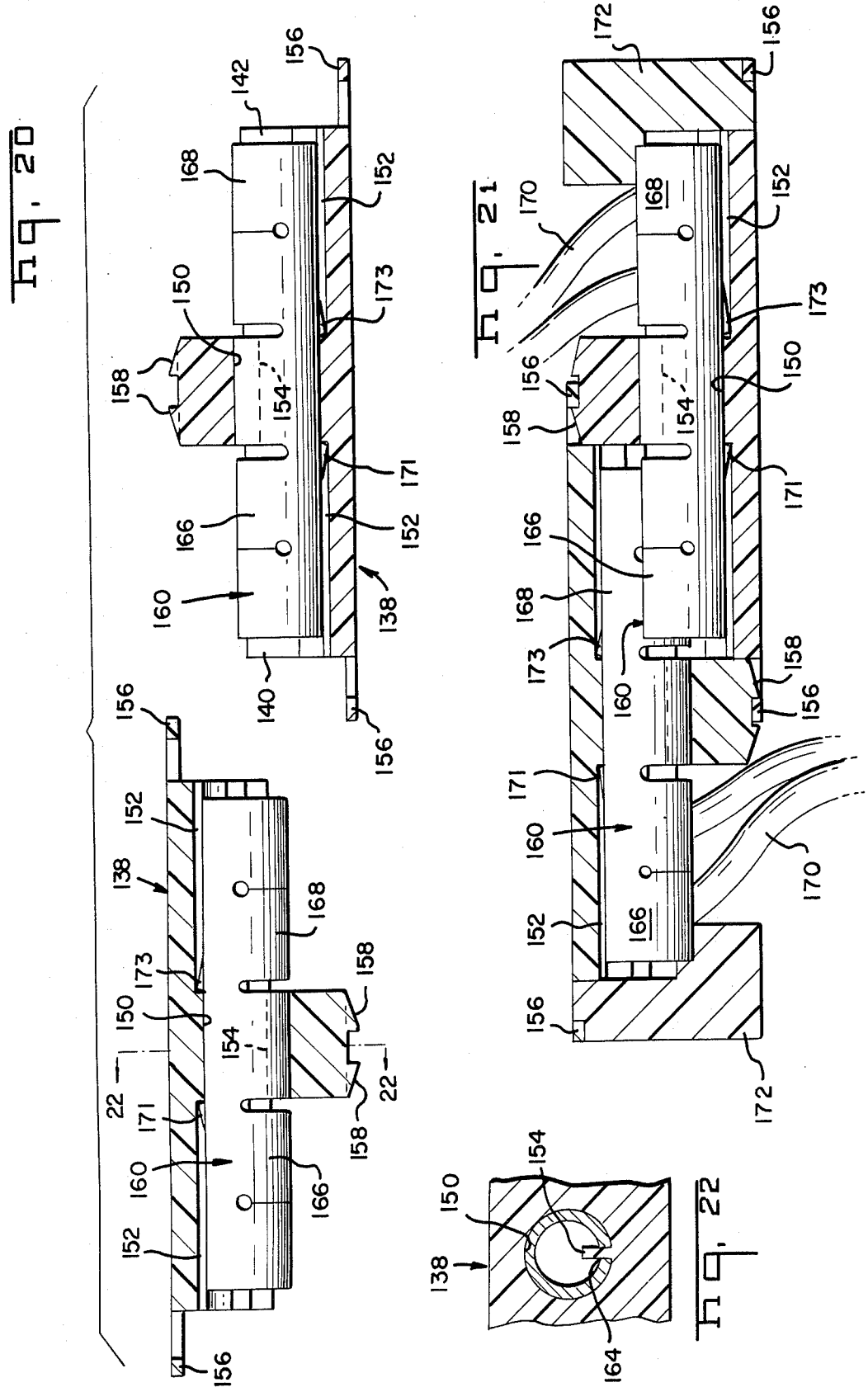

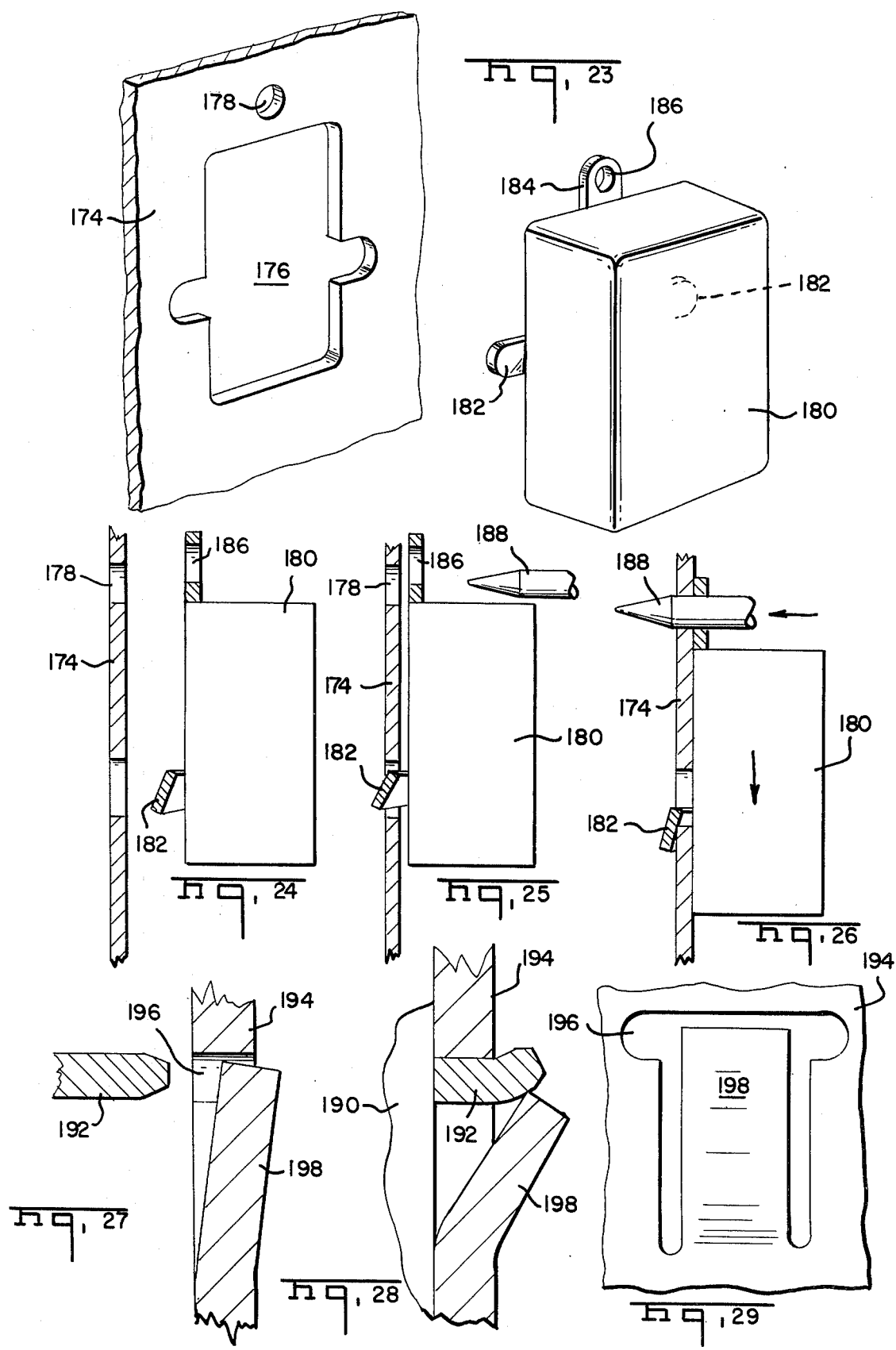

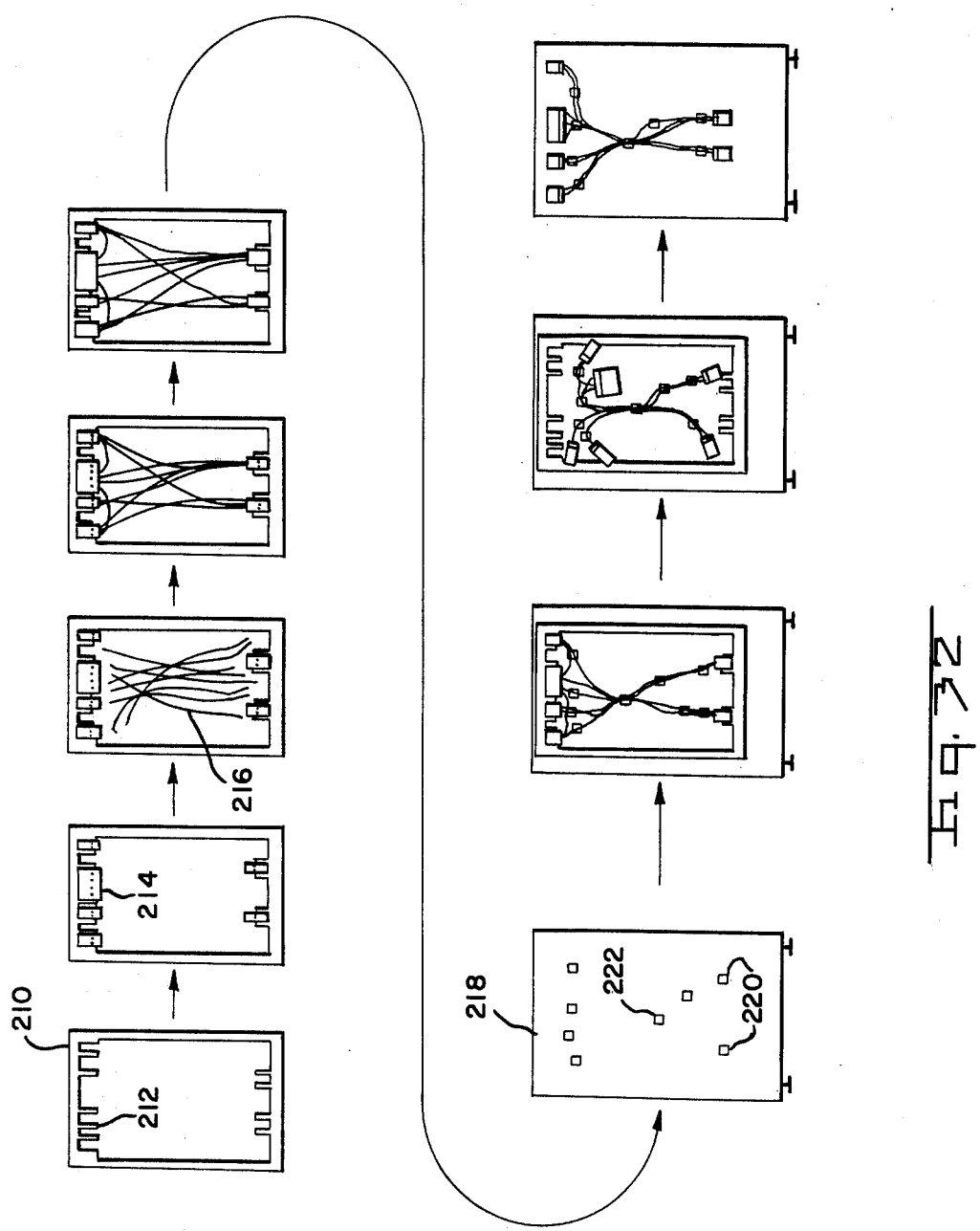

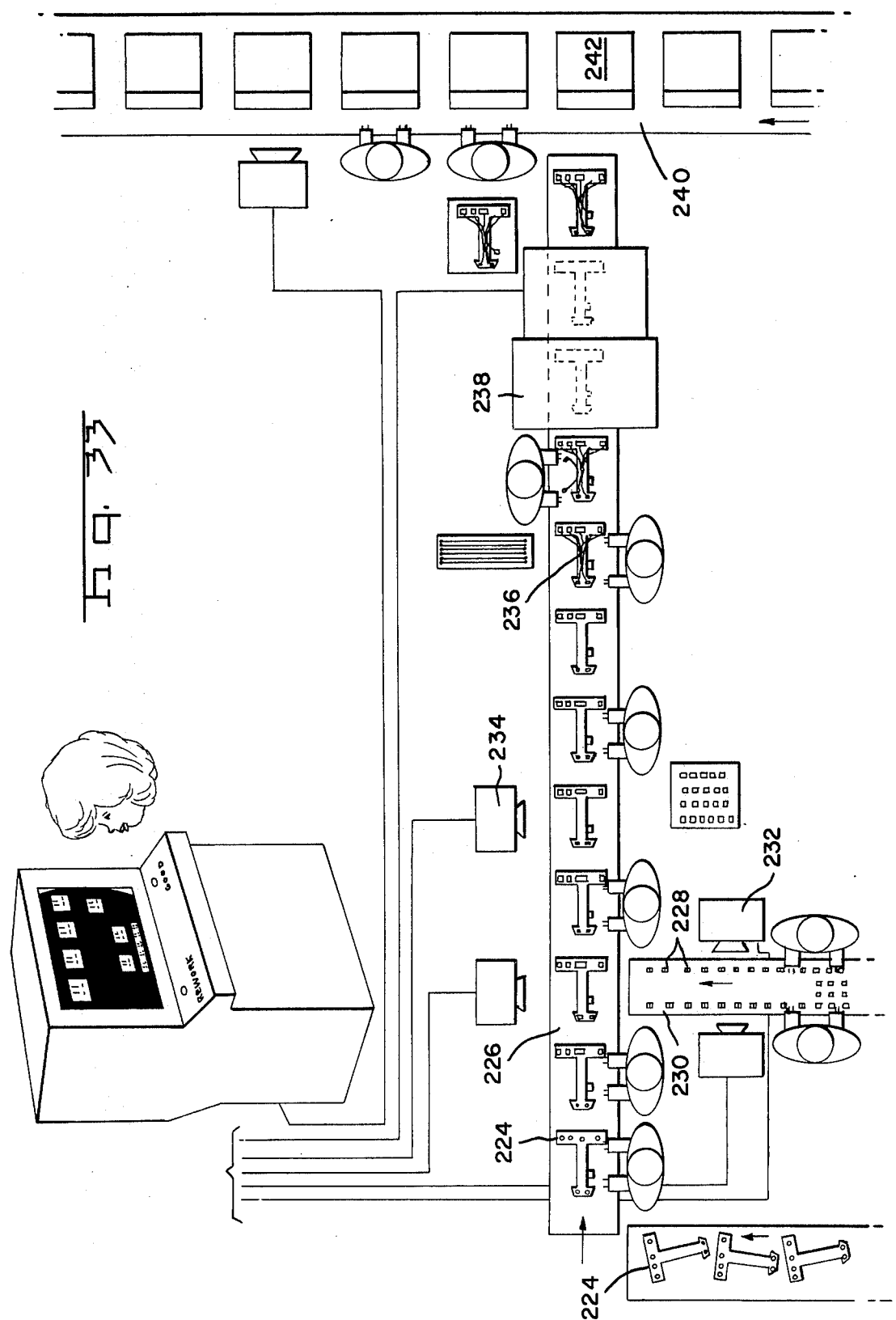

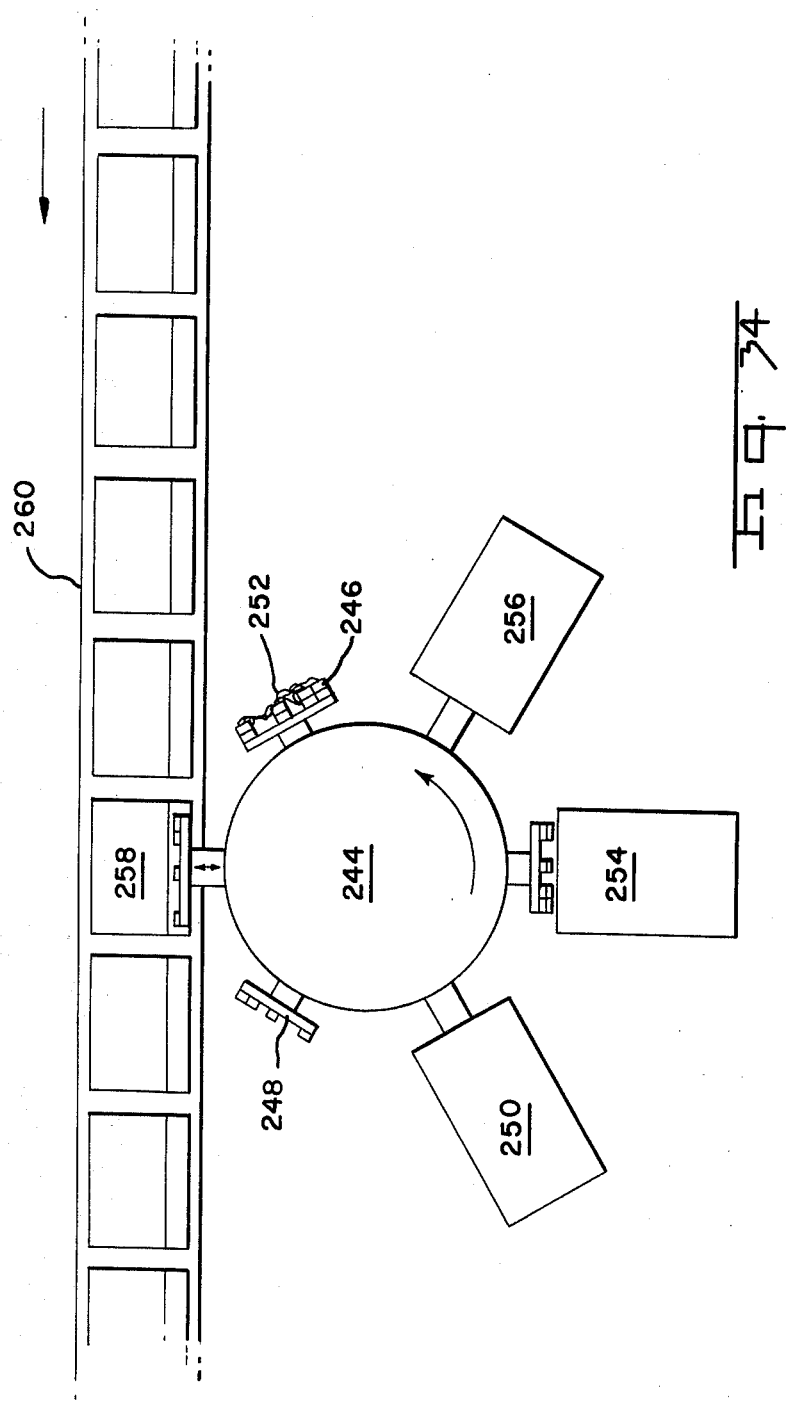

INTRINSIC CERTIFICATION ASSEMBLY TECHNIQUE FOR WIRING COMPONENTS INTO AN ELECTRICAL APPARATUS

This is a division of application Ser. No. 649,009, filed Jan. 14, 1976, now U.S. Pat. No. 4,006,959, which is a division of application Ser. No. 520,399, filed Nov. 4, 1974, now U.S. Pat. No. 3,970,354.

BACKGROUND OF THE INVENTION

1. Field Of The Invention

The present invention relates to a technique, including both methods and apparatus, for positively wiring machines, such as washing machines, dishwashers, television sets, etc., in such a manner as to provide verified locked-in mating of all contacts, connectors and components, and in particular to methods and apparatus which will assure correct assembly of the wiring interconnections of an electrical apparatus at all stages of the assembly.

2. Prior Art

The established practice of assembling electrical devices, such as washing machines, dishwashers, TV sets, and the like, have followed a traditional assembly method which is quite inappropriate for full automated assembly and which is frequently open to human error during assembly. Amongst the human error problems that are frequently encountered in production lines are miswired components, terminals not securely attached to conductors, lack of full engagement of push-on connecting portions, harnesses routed incorrectly, intermixing of control and power circuitry, and improper connection of mating portions. Some of these problems have been reduced by color coding, keying, and polarizing the component subassemblies so that only one reasonable assembly pattern would be possible. This does not, however, allow for instances when inattentive or non-skilled personnel employed in the assembly line partially assemble or forcibly misassemble subcomponents, subassemblies, and mismatch them to the final assembly.

A problem also exists with most known connectors in that there is presently no convenient way to verify whether or not contacts, especially push-on type contacts, have actually been fully mated. Thus there is the possibility of subsequent handling of the apparatus will cause the disconnection of the portions of the electrical wiring by simple vibration.

The second point raised above is the fact that most of the electrical apparatus of the above-mentioned type are currently assembled in such a manner that it would not be feasible to fully automate the production line. Some of the reasons why the production lines cannot be automated is that many machines are designed to require snaking of cables and/or harnesses throughout various portions of the machine. This frequently is an undesirable, as well as an unnecessary, exercise which makes automation of the production line substantially impossible.

SUMMARY OF THE INVENTION

The present invention may be characterized as an assembly technique, including both methods and related apparatus, for reliably and positively interconnecting the contacts, connectors and components of an electrically operated machine so as to provide verified full and proper mating and correct wiring of the machine. The subject method is accomplished by the use of keyed contacts, connectors, and components which form subassemblies mountable in only one position in the final machine assembly. Each component includes means which, in combination with the mating connector, give a positive and readily viewable physical indication that the subassembly is correct and complete. Each subassembly is physically adapted to mate in the final machine in only a single fashion, which mating is physically impossible in cases of incorrect connection of the subassembly. Each connector housing includes at least one contact receiving cavity and a cover means providing strain relief for the associated conductor. The connector housing and the strain relief cover can be produced in great length and cut to the length equal to the desired number of contacts. Each contact includes a mating portion engageable with a relatively wide range of sized mating contacts and an insulation displacing portion adopted to engage at least one related conductor. The connector housing and the contact can be hermaphroditic.

It is therefore an object of the present invention to teach an improved technique for wiring all types of electrical equipment which is an innovative concept deviating in substantially all ways from the known and widely used methods.

It is another object of the present invention to teach a technique for assembling electrical apparatus, such as home laundry washers and dryers, in which contacts, connectors and components are mated in a plurality of subassemblies with each subassembly including indicia which are physically and visibly apparent only upon the proper assembly of the subassembly.

It is still another object of the present invention to teach a technique for wiring electrical apparatus in which subassemblies and interconnecting wiring harness are so arranged that they can be automatically and positively assembled only in the correct fashion and installed into related apparatus in a completely automated manner, with each assembly step being readily verified to assure quality control.

It is yet another object of the present invention to produce an improved electrical connector which, in cooperation with a related component, will give a visible and physical indication of the correct and positive assembly thereof.

It is a further object of the present invention to produce an electrical connector housing which can be produced in great lengths and cut to a length approximating the desired number of contacts.

It is a further object of the present invention to produce an improved electrical connector housing which is hermaphroditic and has means indicating the complete latching thereof.

It is a still further object of the present invention to produce an improved completely hermaphroditic electrical contact terminal having an insulation displacing portion and an intermating portion adapted to engage a relatively wide range of related contacts.

Further objects and advantages of the present invention will become apparent to those skilled in the art from the following detailed description relating to several representative embodiments of the present invention.

BRIEF DESCRIPTION OF THE DRAWINGS

FIG. 3 is an exploded perspective view of the component subassembly of FIG. 2;

FIG. 4 is a detailed view of the component subassembly of FIGS. 2 and 3 showing the assembly verification means;

FIGS. 5, 6 and 7 are side elevations showing the sequential steps of assembling the subject component subassembly onto a panel frame of a machine;

FIG. 8 is a longitudinal vertical section through a connector according to the present invention;

FIG. 9 is a longitudinal vertical section, similar to FIG. 8, showing the subject connector in alignment with a related component;

FIG. 10 is a vertical transverse section through the connector taken along line 10—10 of FIG. 9;

FIG. 11 is a longitudinal vertical section, similar to FIGS. 8 and 9, showing the subject connector fully mated on a related component;

FIG. 12 is an exploded vertical section through the subject connector housing;

FIG. 13 is a perspective view of a first embodiment of the subject contact terminal according to the present invention;

FIG. 14 is a top plan view of the mating portion of the contact terminal of FIG. 12 engaging a thin blade contact;

FIG. 15 is a top plan view, similar to FIG. 14, showing the subject contact terminal engaging a thick blade contact;

FIG. 16 is a diagrammatic section taken along line 16—16 of FIG. 11 showing the engagement of the subject contact terminal with blade contacts of different thickness;

FIG. 18 is a perspective view of an alternate hermaphroditic embodiment of the connector housing according to the present invention;

FIG. 19 is an elevation of the mating end of the connector housing of FIG. 18;

FIG. 20 is a longitudinal vertical section through a pair of aligned connector housings according to FIG. 18;

FIG. 21 is a longitudinal vertical section, similar to FIG. 20, showing the connectors mated;

FIG. 22 is a fragmentary section taken along line 22—22 of FIG. 20;

FIG. 23 is an exploded perspective view of an alternate mounting arrangement for a component subassembly according to the present invention;

FIGS. 24 to 26 are side elevations showing the sequential steps of mounting a component subassembly according to the alternate embodiment of FIG. 23;

FIGS. 27 and 28 schematically show another alternate means for mounting a component subassembly according to the present invention;

FIG. 29 is a plan view of a panel slot for receiving the mounting means of FIGS. 27 and 28;

FIG. 32 is a diagrammatic view of the sequential steps of wiring an electrical apparatus according to the present invention;

FIG. 33 is a schematic representation of a production line for carrying out another method of wiring a machine according to the present invention; and FIG. 34 is a schematic representation of a fully automated production line in accordance with the present invention.

DETAILED DESCRIPTION OF THE PREFERRED EMBODIMENT

Figure 1:
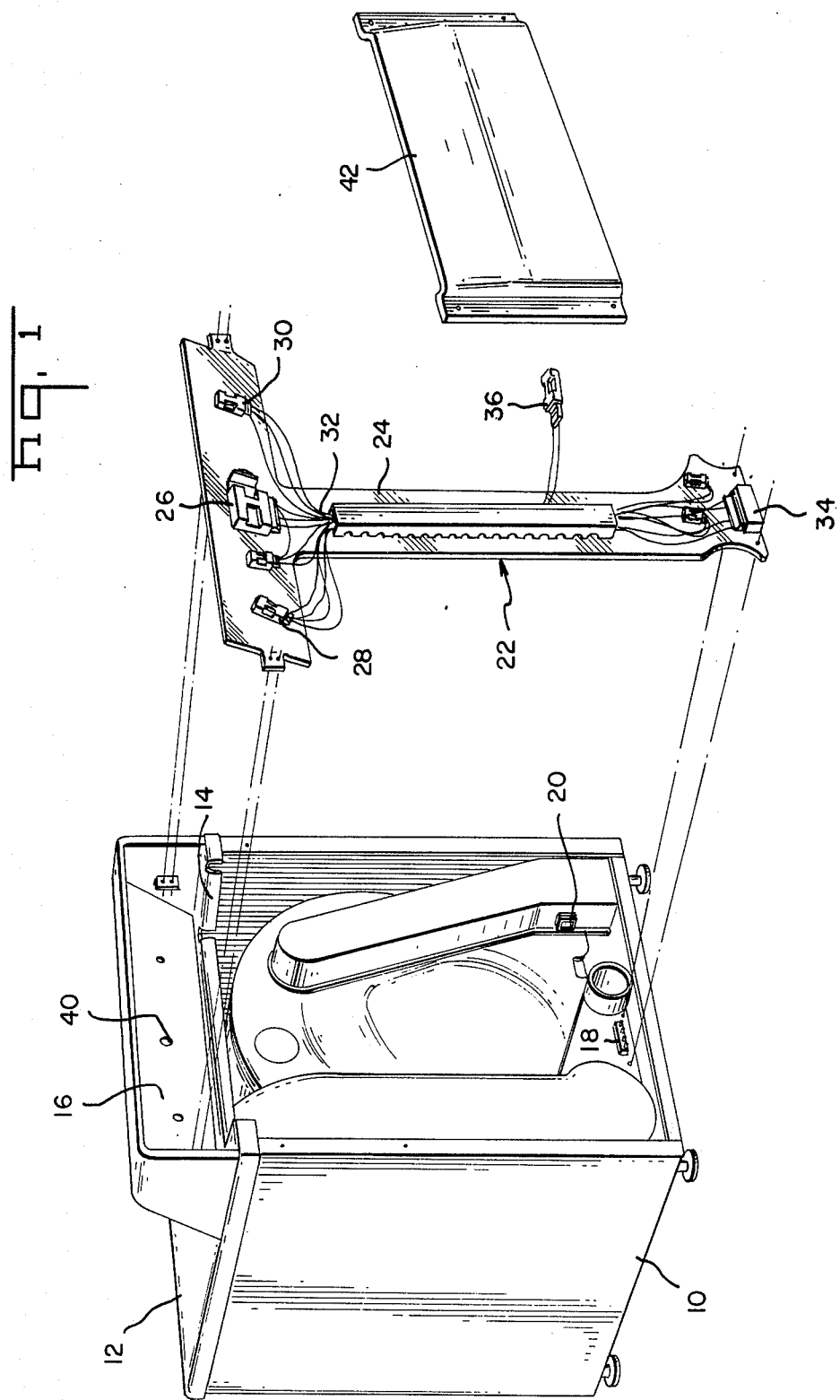
FIG. 1 is an exploded perspective view of an electrical apparatus, in this case a home laundry dryer, wired according to the present invention.

FIG. 1 is an exploded rear perspective view of a home laundry dryer as a representative example of the type of machine which can be wired by the subject assembly technique. The illustrated dryer 10 includes the conventional components, such as a motor, blower, heater coils, and solenoid actuating means (none of which are shown in detail) and only those portions of the machine which are different or necessary for the description of the subject technique will be described in detail.

The machine illustrated differs from similar conventional machines of this type by replacing the normal rectangular or square top cover 12 with a cover having a notched or cut-out back edge 14 so that it is not necessary to snake any portion of the wiring harness between the control panel 16 and the motor, etc. (not shown). It should be noted that all the connectors 18, 20 for the motor, blower, etc. have been moved to the rear wall of the machine. For example, the conventional washing machine has a motor substantially centered within the cabinet and has a connector immediately adjacent thereto. In the present instance, the motor is provided with longer leads and the connector 18 is fixed to the machine frame adjacent the rear wall of the machine. The conventional wiring harness has been replaced with the wiring assembly 22 which includes a T-shaped jig or frame 24. The control components 26 and their related connectors 28 form a plurality of subassemblies 30 interconnected by conductors 32 to connectors 34, 36 and preassembled on the frame 24. The entire wiring assembly 22 is simply inserted into the machine making sure that the projecting shafts 38 of the control components 26 pass through the apertures 40 in the control panel 16. All components 26 will be properly located with respect to panel 16 and all unconnected connectors 34, 36 will also be correctly located so that it will be substantially impossible to miswire or misassemble the machine. The rear cover 42 is mounted on the machine after the wiring assembly 22 has been completely installed.

Turning now to the individual components which make up the subassemblies of the subject wiring assembly, FIGS. 2 through 7 show a representative component subassembly 30 including a component 26, such as a temperature control, and connector 28 mated therewith. The component is shown with a profiled housing having a central rib 44 which will accommodate machine handling of the component. The component 26 further includes a mounting tongue 46 extending from a first side and at least one blade contact terminal 48 depending from a second opposite side. On the same side as the blade contact terminals 48 there is at least one verification tine 50, the purpose of which will be discussed later. Each connector 28 includes a housing 52 having a plurality of contact channels 54, at least one mounting aperture 56, a strain relief cover member 53 adapted to detachably engage the housing 52, at least one blind first bore 60, each aligned with a respective verification tang, and at least one coded notch 62. The first blind bores 60 have only a thin frangible diaphragm 64 covering one end thereof.

Figure 2:
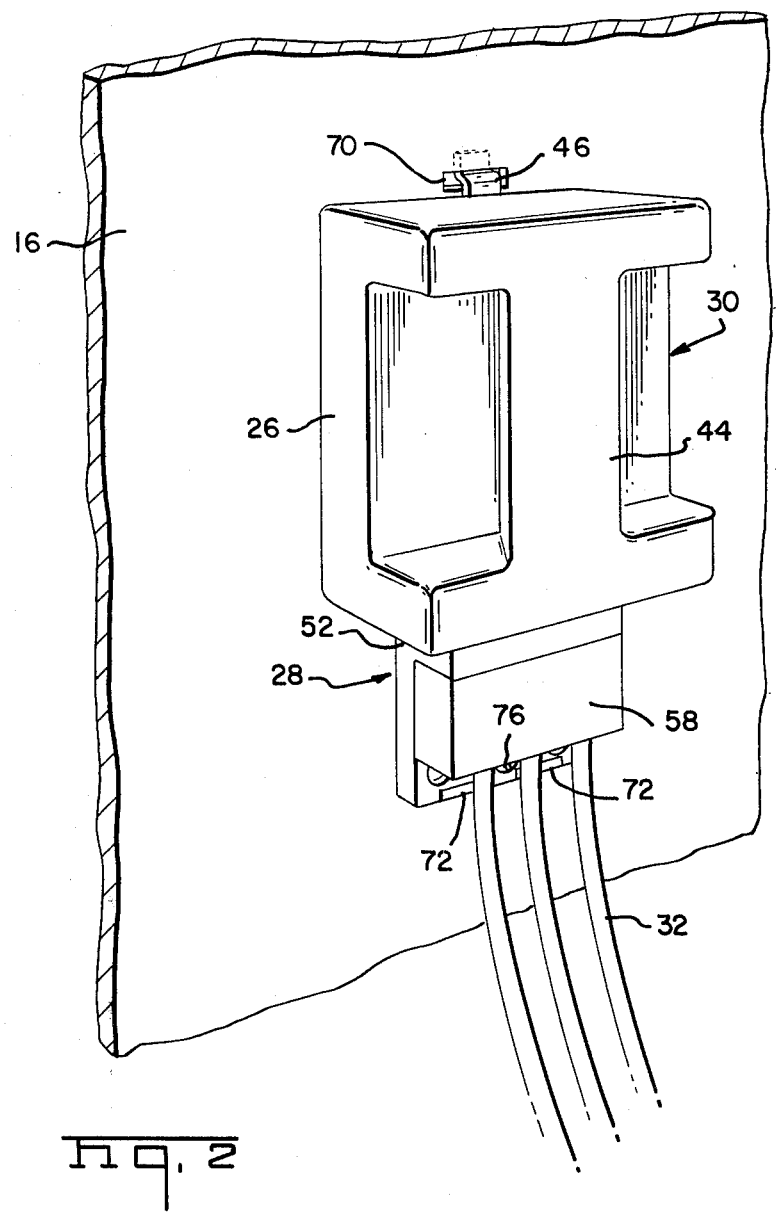
FIG. 2 is a perspective view of a component subassembly according to the present invention.

When the connector 28 is assembled with the component 26, as shown in FIGS. 2 and 11, each blade contact terminal 48 is engaged by a respective contact terminal 66 mounted in the channels 54 of the connector housing 52 while the verification tine 50 passes through the related first blind bore 60 and ruptures the diaphragm 64. Thus the tine 50 will project through the wall 68 of the connector housing to provide a visible and physical indication that the connector 28 has been properly and fully mated on the component 26. Thus the component subassemblies 30, according to the present invention, can be readily connected by even visually handicapped workers with complete assurance of correct and complete mating. The subassemblies also can be machine scanned, during a quality control procedure, since the presence or absence of the protruding tines can be readily detected.

The component subassembly 30 is mounted on the control panel 16 in the manner shown sequentially in FIGS. 5 to 7. The mounting tongue or blade 46 is passed through a mounting slot 70 in the panel 16 with the subassembly 30 subsequently being pivoted into position as shown in FIGS. 6 and 7 with the control shaft 38 of the component extending through opening 40. If the subassembly is not completely mated, then the overall length of the component 26 and connector 28 will be greater than the distance between the slot 70 and the mounting steps 72. It should also be noted that the steps 72 are keyed to the notches 62 in the connector housing 52 to assure that the proper subassembly is being mounted at the proper location. As a further insurance that the proper subassembly 30 will be correctly located, the mounting aperture 56 in the connector housing 52 must align with the threaded bore 74 in the panel 16 in order for the screw 76 to pass therethrough to complete the fixed mounting of the subassembly on the panel. It should be here noted that at least some of the mounting apertures 56 can be closed by a frangible diaphragm 78 which is adapted to be pierced by a related, fixed verification tine 80, see FIG. 11, on panel 16.

Turning now to the contact terminal 66 itself, the details of the subject contact terminal 66 will be explained with reference to FIG. 13, although the contact is also shown in FIGS. 8 to 12 and 14 to 16. The contact terminal 66 includes an insulation displacing, conductor engaging first portion 82 and an integral barrel shaped, mating contact engaging second portion 84. The first portion 82 is similar to that shown in U.S. Pat. No. 3,760,335, and includes two pairs of upstanding members 86, 88 each defining therebetween an insulation displacing, conductor engaging slot 90. At least two laterally directed flanges 92 extend from the contact and serve both to stabilize the contact in the connector housing as wall as to limit the forward motion of the contact in the associated connector channel. The contact matable portion 84 has at least two serially connected barrel portions 94, 96 with a longitudinal slot 98 extending the length thereof. Each of the portions 94, 96 is separated from the adjacent portion by a slot 100 extending about a portion of the surface thereof. Each slot 100 is terminated by a strain relief hole 102. Each contact also includes a locking lance 104 struck from the bottom of the contact and used to restrain the rearward movement of the contact from the associated housing by engaging in aperture 106.

The operation of the contact is standard in its engagement with the associated conductor 32. As mentioned previously, this portion of the contact is of a well known construction. However the mating portion 84 of the contact 66 is unique. Preferably the slot 98 is slightly wider in portion 94 than in the portion 96. Thus when the contact 66 is engaged with a thin blade contact, as shown in FIG. 14 and the center of FIG. 16, the blade will readily pass through the wide portion of the slot 98 in portion 94 and will be engaged by the walls defining the slot 98 in second portion 96. Thus there will be a two sided engagement of the blade over a substantial portion of its length. The engagement is made with a wiping action longitudinally of the blade so that an essentially gas tight contact will be formed. In the case of a thicker blade contact, as shown in FIG. 15 and the right hand side of FIG. 16, both portions 94, 96 will engage the sides thick blade so that there will be a four area engagement between the terminals.

Because of the particular structure of the barrel portion 84 of the contact, each blade 48 will be engaged with a force acting substantially normal to the plane of the blade. Thus it is extremely unlikely that the barrel portion 84 of the contact will ever be so overstressed by the insertion of an extremely thick blade as to deform the portions 94, 96 so that they will no longer make a good spring engagement with a thinner blade.

The above described connector housing is of such a configuration that it can be produced in great lengths and cut to whatever length is necessary to make the appropriate connection with a component. This feature can best be understood with reference to FIG. 10. The housing 52 has a plurality of parallel spaced contact terminal receiving channels 54 therein. Each channel 54 has a cylindrical portion 108 which receives the barrel portion of the associated contact terminal and a profiled open channel-shaped rear portion 110. The cylindrical portion includes an axial groove 112 which receives a portion of the blade contact. Each channel portion is defined by a pair of identical parallel spaced walls 114 with each wall having a longitudinal ledge or step 116 on both sides thereof. The housing is cut to length along lines running axially of the channels. In this embodiment the strain relief cover 58 is formed in specific lengths. Each cover 58 includes a pair of parallel, spaced apart side walls 118, 120 each having an inwardly directed step or ledge 122, 124 which lockingly engages the corresponding step 116 in the connector housing 52.

The strain relief cover 58 can be made in two widths as can be seen from a comparison of FIGS. 8 and 9. The narrow cover, see FIG. 8, allows for a so-called daisy chain connection with contact terminals 66 engaging conductors 32 intermediate the ends thereof. The wider version of the cover, see FIG. 9, would be used with terminals engaging the ends of conductors 32.

The subject contact 66 can be preloaded into the housing 52 and subsequently engaged with conductors 32. The contacts 66 are held in position within the housing by the engagement of the locking lance 104 in an aperture 106 in the base of the housing and the engagement of the tabs 92 with shoulders 126 of the housing 52 thereby preventing the forward or rearward movement of the contact relative to the housing.

Figure 17:
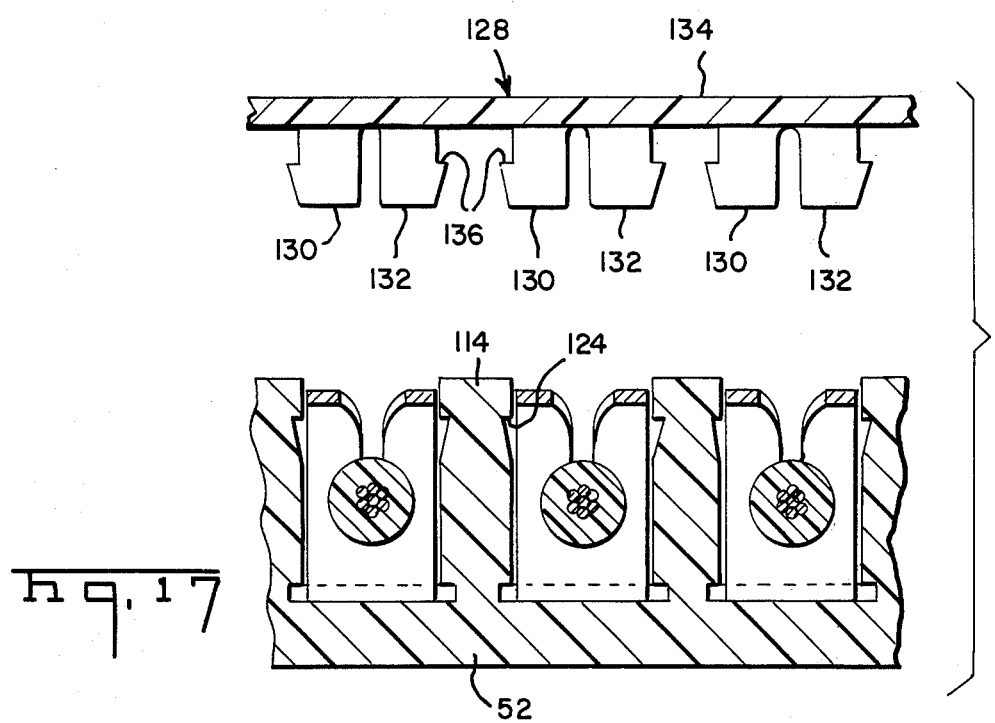
FIG. 17 is an exploded rear elevation of an alternate embodiment of the strain relief means for a connector housing according to the present invention.

An alternate embodiment of the strain relief cover is shown in FIG. 17. This cover 128 includes a plurality of pairs of spaced parallel legs 130, 132 depending integrally from a continuous backing member 134. Each leg has a shoulder or step 136 adapted to engage a corresponding ledge 124 in the housing 52. As is the case with the housing 52, this embodiment of the strain relief cover can be produced in great lengths and cut to the desired length between the pairs of legs 130, 132.

A completely hermaphroditic embodiment of the connector housing and contact are shown in FIGS. 18 to 22. This housing 138 is substantially symmetrical with contact supporting portions 140, 142 on opposite sides of a central portion 144. A plurality of contact passages 146 extend through the housing and comprise channels 148, in each portion 140, 142, and a passage 150 through portion 144. Each channel 148 has an axial groove 152 therein and each passage 150 has a keying flange 154 extending radially therein. At least one locking member 156 extends from opposite ends of the housing 138 and is adapted to mate with a corresponding stud 158 on the central portion of a mating housing member.

The hermaphroditic contact 160 is somewhat of a double ended version of the previously described contact terminal 66. This contact 160 has a main body portion 162 which is barrel shaped and contains a longitudinally extending slot 164. Extending integrally from each end of the body portion are barrel-shaped contacting portions 166, 168, which are substantially identical to the mating portion 84 of the previously described contact 66 (see FIG. 13) and therefor will not be discussed in detail. A pair of lances 171, 173 are also struck from the contact 160. The contacts 160 are mounted in the housing 138 by aligning the lances 171, 173 with groove 152 and sliding the contact axially through the housing until each lance 171, 173 lies in its respective groove 152 on opposite sides of the central portion 144. The contact 160 will be prevented from moving axially out of the housing by the lances engaging in the grooves and from rotating about its own axis both by flange 154 extending through slot 164 and the lances in the grooves. The flange and slot are preferably narrower than the slots in the portions 166, 168 in order to prevent overstressing these portions during assembly of the contacts into the connector housing.

Contacts 160 make an insulation displacing engagement with conductors 170 by simply slipping the conductors axially through the slots of one of the portions 166, 168. Since each portion is divided in half, two conductors of different sizes can be engaged by one portion of the contact. An end cover 172 is mounted on the housing 138 by engaging in locking members 156 and serves to prevent the conductors from slipping out of the ends of their respective contacts. The loaded and wired connector housings are mated by reversedly positioning two housings, with respect to each other, and bringing them axially together, as shown in FIG. 21. It will be seen from FIG. 19 that the contacts 160 are offset within the housing and thus will be offset with respect to the contacts in the mating housing. The contacts 160 will engage by their respective barrel portions intermating through their respective slots, as shown in phantom in FIG. 19. The housing members will be locked together by mating of locking members 156 with studs 158.

FIGS. 23 to 31 show three further alternate methods and means for mounting components onto panels. Each of these methods has the particular advantage that it is suitable for completely automated assembly. In the first embodiment, the panel 174 has a profiled aperture 176 and a locking aperture 178. The component 180 has a pair of tines 182 which engage in the profiled aperture 174 bayonet fashion. There is also a locking tine 184 extending from the component with a bore 186 in the tine. The component is mounted as shown in FIGS. 24 to 26. First the component is loosely mounted on the panel and then driven downwardly into a fully engaged position by a needle nosed shaft 188 which aligns bore 186 and locking aperture 178. The tines 182 preferably are canted, as shown, so as to effect a camming motion to draw the component tightly against the panel as the component is driven downwardly.

Another alternate mounting arrangement is shown in FIGS. 27 to 29. The component 190 is provided with a number of mounting tines 192 and the related panel 194 is provided with a like number of profiled apertures 196, each of which defines a cantilever locking arm 198. Preferably the locking arm 198 is somewhat stiffer than the tine 192. The component 190 is simply pressed into position with the tines 192 displacing and passing the locking arms 198 which then resiliently deflect against the tine.

Figure 30:
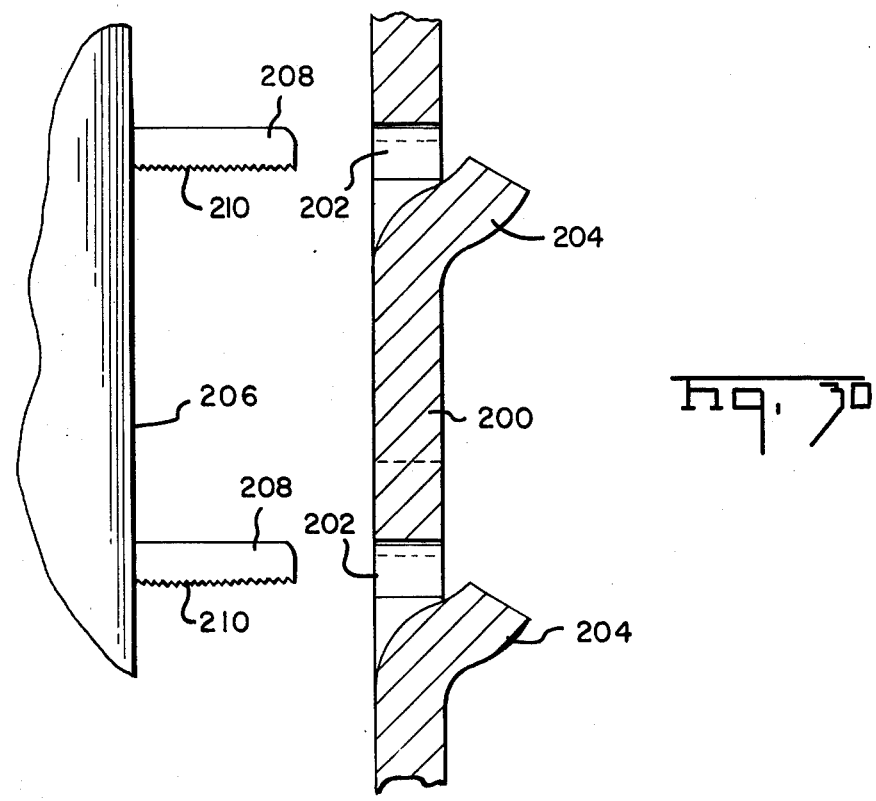
FIG. 30 is an exploded side elevation of another alternate embodiment of a mounting means for a component subassembly according to the present invention.
Figure 31:
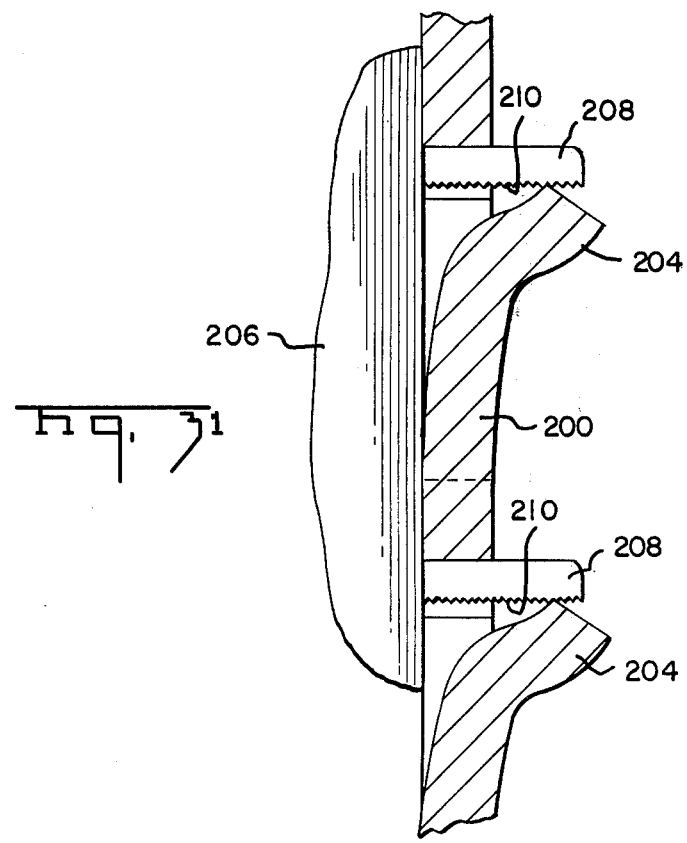
FIG. 31 is a side elevation showing the component of FIG. 30 fully mounted on a related panel.

A somewhat modified arrangement of the above described mounting means is shown in FIGS. 30 and 31. Again the panel 200 is provided with profiled apertures 202, similar to those of FIG. 29, with each aperture defining a cantilever arm 204. The component 206 is provided with tines 208 having stirations 210 on one side thereof. The component is mounted by simply pushing the tines 208 through the related apertures 202. The arms 202 engage in the stirations 210 to hold the component in place.

A first system for incorporating the subject invention will be explained with reference to FIGS. 32, which is a schematic diagram of the progressive steps in the wiring of a machine according to the present invention. A jig 210 is formed with a plurality of pairs of component engaging tines 212 therein. A plurality of components 214 are inserted into the various tines at a first station. Preferably the components and tines are keyed so as to be engageable only in the correct position. A wiring harness 216 is deposited in the jig and the individual wires are appropriately connected to each of the respective components. The wires can either be connected to contacts, such as those previously described in the present specification, which have been preloaded in the respective connectors or appropriate terminals can be precrimped onto the wires. It is also forseeable to use a point-to-point wiring system at this step instead of a preformed harness. The wiring assembly is thus completed and the jig 210 is placed on to the back of the machine 218 and held in position by known means, such as clips 220. The wires are preferably pressed into retaining clips 222 and the components 214 are removed from the tines of the jig. The jig 210 is then removed from the back of the machine 218 and the components 210 are pressed into position and held by means such as those shown in FIGS. 23 to 31. Thus there is a positive sequence of steps of assembly with each step being secured against error of connection, insertion or misalignment of components. Also, there is a quality control check available at the end of each step by observing, with viewing or mechanical means, whether or not the verification tines have penetrated their respective diaphragms.

FIG. 33 illustrates a somewhat similar assembly approach using a T-shaped jig 224, which is similar to the one shown in FIG. 1. The jig 224 is placed onto a first continuous conveyor 226. The components 228 are fed by a second conveyor 230 past a quality control screening station 232 to assure the proper components are being fed to the first conveyor. The components 228 are manually inserted into the correct location on the jig with each attachment being confirmed by a quality control scanner 234. At a subsequent station a wiring harness 236 is deposited on the jig 224 and the connectors of the harness are inserted onto the associated components 228. As an alternative to using a wiring harness, a known point-to-point type of automated wiring could be employed at this step. The assembly is then passed through another quality control scanner 238 to the assembly line 240 where they are mated and mounted with the machine 242 being produced.

A fully automated arrangement is schematically outlined in FIG. 34 wherein a carousel robot 244 is used with components 246 being placed on a permanent jig 248 at a first station 250, a wiring harness 252 interconnecting the components at a second station 254 and a quality control check run at a third station 256. The completed and approved assembly is then inserted into a machine 258 moving along a production line 260.

The subject contact and connector have been described engaging specific terminals and components. It will be readily appreciated by those skilled in the art that the same principles can be applied to achieve similar excellent electrical and mechanical engagement between the subject contact and a variety of conductors and terminals as well as between the subject connector and similar connectors, such as for a line splice, and between components and/or subassemblies. The principles involved can be used to achieve positive mating between any two or more members.

The indicia has also been described as becoming uncovered or visible when mating is complete and correct. These same principles can be applied to embodiments in which the covering or concealment of the indicia will indicate correct mating.

The present invention may be subject to many modifications and variations without departing from the spirit or essential characteristics thereof. The present embodiments should therefor be considered in all respects as merely illustrative and not restrictive of the scope of the present invention.

What is claimed is:
1. An improved electrical connector housing comprising:
an elongated, continuous base member having a plurality of parallel, substantially identical contact receiving passages transversely spaced therealong, each said passage including an open rear end portion defined by a pair of parallel spaced walls integrally upstanding from said base member, each said wall having a longitudinal ledge on both sides thereof, and a closed, substantially cylindrical front end portion and means in each passage engageable with latching means of a respective contact received therein,
a strain relief cover having a plurality of spaced pairs of integral leg portions depending from an elongated continuous member, each said leg portion having a longitudinally extending step engageable with a corresponding ledge of said walls;
said base member and said strain relief cover being made in great lengths and cut to a length containing the desired number of contact receiving passages.

* * * * *